United States Patent
Chong et al.

(10) Patent No.: US 7,326,591 B2
(45) Date of Patent: Feb. 5, 2008

(54) INTERCONNECTING SUBSTRATES FOR MICROELECTRONIC DIES, METHODS FOR FORMING VIAS IN SUCH SUBSTRATES, AND METHODS FOR PACKAGING MICROELECTRONIC DEVICES

(75) Inventors: Chin Hui Chong, Singapore (SG); Choon Kuan Lee, Singapore (SG); David J. Corisis, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 238 days.

(21) Appl. No.: 11/217,152

(22) Filed: Aug. 31, 2005

(65) Prior Publication Data

US 2007/0045834 A1    Mar. 1, 2007

(51) Int. Cl.
H01L 21/00    (2006.01)
(52) U.S. Cl. .................. 438/106; 257/E21.122
(58) Field of Classification Search ................ 438/106; 257/E21.122
See application file for complete search history.

(56) References Cited

U.S. PATENT DOCUMENTS

| | | | |
|---|---|---|---|
| 6,011,694 A | 1/2000 | Hirakawa | |
| 6,043,557 A | 3/2000 | Phelps, Jr. et al. | |
| 6,214,641 B1 | 4/2001 | Akram | |
| 6,232,551 B1 | 5/2001 | Chang | |
| 6,249,052 B1 | 6/2001 | Lin | |
| 2002/0121688 A1 | 9/2002 | Kinsman et al. | |
| 2003/0011075 A1 | 1/2003 | Ohuchi et al. | |
| 2003/0116866 A1 | 6/2003 | Cher 'Khng et al. | |
| 2003/0150641 A1 | 8/2003 | Kinayman et al. | |
| 2003/0164303 A1 | 9/2003 | Huang et al. | |
| 2004/0094833 A1 | 5/2004 | Hasegawa et al. | |
| 2005/0112871 A1 | 5/2005 | Ahn et al. | |
| 2005/0253284 A1 | 11/2005 | Wang et al. | |

OTHER PUBLICATIONS

Search Report and Written Opinion for Singapore Patent Application No. 200505618-9, mailed Dec. 11, 2006, 12 pages.
Search Report and Written Opinion for International Patent Application No. PCT/US2006/031280, mailed Feb. 2, 2007, 12 pages.

*Primary Examiner*—Scott B. Geyer
*Assistant Examiner*—Elias Ullah
(74) *Attorney, Agent, or Firm*—Perkins Coie LLP (57) ABSTRACT

Substrates for mounting microelectronic dies, methods for forming vias in such substrates, and methods for packaging microelectronic devices are disclosed herein. A method of manufacturing a substrate in accordance with one embodiment of the invention includes forming a conductive trace on a first side of a sheet of non-conductive material, and forming a via through the non-conductive material from a second side of the sheet to the conductive trace. The method further includes removing a section of the non-conductive material to form an edge of the non-conductive material extending across at least a portion of the via. In one embodiment, forming the edge across the via exposes at least a portion of the second conductive trace for subsequent attachment to a terminal on a microelectronic die.

35 Claims, 6 Drawing Sheets

INTERCONNECTING SUBSTRATES FOR MICROELECTRONIC DIES, METHODS FOR FORMING VIAS IN SUCH SUBSTRATES, AND METHODS FOR PACKAGING MICROELECTRONIC DEVICES

TECHNICAL FIELD

The following disclosure relates generally to interconnecting substrates for microelectronic dies and, more particularly, to methods for coupling microelectronic dies to interconnecting substrates having conductive traces on two sides.

BACKGROUND

Conventional die-level packaged microelectronic devices typically include a microelectronic die, an interposer substrate or lead frame attached to the die, and a moulded casing around the die. The die generally includes an integrated circuit coupled to a plurality of bond-pads. The bond-pads are typically coupled to contacts on the interposer substrate or lead frame, and serve as external electrical contacts through which supply voltage, signals, etc., are transmitted to and from the integrated circuit. In addition to contacts, interposer substrates can also include ball-pads coupled to the contacts by conductive traces supported in a dielectric material. Solder balls can be attached to the ball-pads in one-to-one correspondence to define a "ball-grid array." Packaged microelectronic devices with ball-grid arrays are generally higher grade packages that have lower profiles and higher pin counts than conventional packages using lead frames.

One process for making a packaged microelectronic device with a ball-grid array includes (a) forming a plurality of dies on a semiconductor wafer, (b) cutting the wafer to separate or singulate the dies, (c) attaching individual dies to an interposer substrate, (d) wire-bonding bond-pads on the dies to contacts on the interposer substrate, and (e) encapsulating the dies with a suitable moulding compound. Packaged microelectronic devices made in the foregoing manner are often used in cellphones, pagers, personal digital assistants, computers, and other electronic products. As the demand for these products grows, there is a continuing drive to increase the performance of packaged microelectronic devices while at the same time reducing the height and surface area or "footprint" of such devices on printed circuit boards. Reducing the size of microelectronic devices, however, becomes more difficult as the performance increases because higher performance typically requires more integrated circuitry and bond-pads. In addition, increasing circuit density can lead to noise during high-speed signal transmission.

Figure 1:
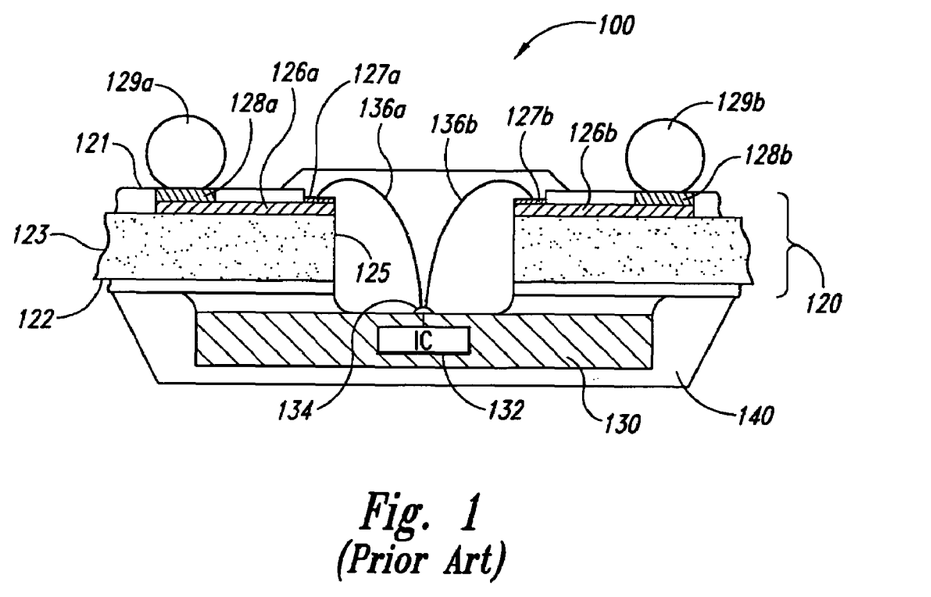
FIG. 1 is a schematic cross-sectional view of a packaged microelectronic device configured in accordance with the prior art.

FIG. 1 is a schematic cross-sectional view of a packaged microelectronic device 100 configured in accordance with the prior art. The packaged microelectronic device 100 includes a die 130 bonded to an interposer substrate 120 in a conventional "board on chip" arrangement. The interposer substrate 120 includes a sheet of non-conductive material 123 (e.g., BT resin, FR4, etc.) having a first side 121, an opposing second side 122, and a slot 125 extending therethrough. Conductive traces 126 (identified individually as a first conductive trace 126a and a second conductive trace 126b) are formed on the first side 121 of the non-conductive material 123 on opposite sides of the slot 125. Each of the conductive traces 126 extends between a contact 127 and a corresponding ball-pad 128. Solder balls 129 can be deposited on the ball-pads 128 to form part of a ball-grid array.

The die 130 includes an integrated circuit 132 electrically coupled to a series of bond-pads 134 (only one of the bond-pads 134 is shown in FIG. 1). The integrated circuit 132 is electrically coupled to the ball-grid array by individual wire-bonds 136 that extend from the bond-pads 134 to the contacts 127. After the wire-bonds 136 have been attached, the die 130 and the adjacent portion of the substrate 120 can be encased in a suitable mold compound 140.

As the speed of the packaged microelectronic device 100 increases and the size becomes smaller, the first side 121 of the non-conductive material 123 becomes very congested with conductive traces. The congestion limits the ability to match input and output trace lengths to reduce signal transmission problems. In addition, the close proximity of signal traces to ground and power planes or ground and power traces can cause signal noise due to a phenomenon known as ground/power bounce.

Figure 2:
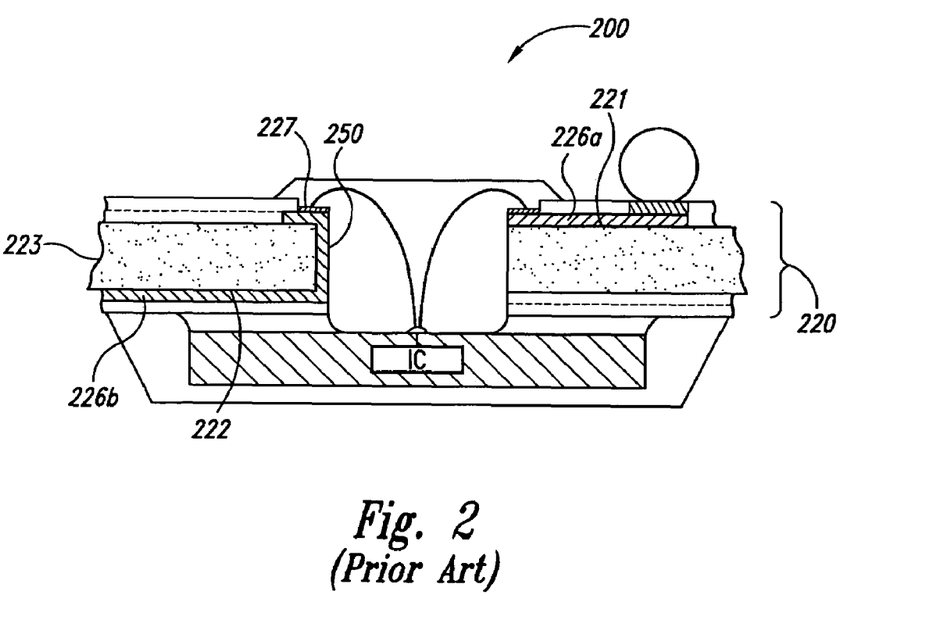
FIG. 2 is a schematic cross-sectional view of another packaged microelectronic device configured in accordance with the prior art.

FIG. 2 is a schematic cross-sectional view of a packaged microelectronic device 200 having conductive traces 226 on both sides of a substrate 220. Specifically, the substrate 220 includes a first conductive trace 226a on a first side 221 of a non-conductive material 223, and a second conductive trace 226b on a second side 222 of the non-conductive material 223. A portion of a plated via 250 extends through the non-conductive material 223 to electrically couple the second conductive trace 226b to a contact 227 on the first side 221.

Although moving the second conductive trace 226b to the second side 222 of the substrate 220 does reduce the trace count on the first side 221, the plated via 250 still adds to the congestion on the first side 221 and can cause trace routing constraints. A further shortcoming of this configuration is that the plated via 250 increases the length of the inductance loop when the second conductive trace 226b is used for power or ground purposes. Increasing the length of the inductance loop can cause additional noise during signal transmission.

DETAILED DESCRIPTION

A. Overview

The following disclosure describes several embodiments of packaged microelectronic devices, interconnecting substrates for packaged microelectronic devices, and methods for forming vias in interconnecting substrates. One aspect of the invention is directed toward a method of manufacturing a substrate for attachment to a microelectronic device. The method includes forming a conductive trace on a first side of a non-conductive material, and forming a hole through a second side of the non-conductive material to the conductive trace. The hole is formed so that at least a portion of the conductive trace covers the hole on the first side of the non-conductive material. The method can further include forming an edge of the non-conductive material that crosses through at least a portion of the hole. In one embodiment, forming an edge of the non-conductive material can include removing a section of the non-conductive material to form a slot through the non-conductive material.

Another aspect of the invention is directed to a method of manufacturing a microelectronic device having a die with a plurality of terminals electrically coupled to an integrated circuit. The method includes attaching the die to a substrate that has a first conductive trace on a first side of a non-conductive material and a second conductive trace on a second side of the non-conductive material. The method further includes electrically coupling a first terminal on the die to the first conductive trace on the first side of the non-conductive material, and electrically coupling a second terminal on the die to the second conductive trace on the second side of the non-conductive material. In one embodiment, electrically coupling the first terminal to the first conductive trace can include attaching a first wire-bond from the first terminal to the first conductive trace. Similarly, electrically coupling the second terminal to the second conductive trace can include attaching a second wire-bond from the second terminal to the second conductive trace.

A further aspect of the invention is directed toward a substrate for attachment to a microelectronic device. The substrate includes a sheet of non-conductive material having a first conductive trace on a first side and a second conductive trace on a second side opposite to the first side. The first conductive trace has a first surface facing away from the non-conductive material and a second surface facing toward the non-conductive material. Similarly, the second conductive trace has a third surface facing away from the non-conductive material and a fourth surface facing toward the non-conductive material. The substrate further includes a first electrical contact area on the first surface of the first conductive trace and a second electrical contact area on the fourth surface of the second conductive trace. In one embodiment, the first contact area can include a first area of exposed metal plating suitable for attachment to a first wire-bond, and the second contact area can include a second area of exposed metal plating suitable for attachment to a second wire-bond.

Specific details of several embodiments of the invention are described below with reference to FIGS. 3A-6 to provide a thorough understanding of such embodiments. Other details describing well-known structures often associated with microelectronic devices and microelectronic device mounting substrates are not set forth in the following description to avoid unnecessarily obscuring the description of the various embodiments. Persons of ordinary skill in the art will understand, however, that the invention may have other embodiments with additional elements or without several of the elements shown or described below with reference to FIGS. 3A-6.

Figure 3A:
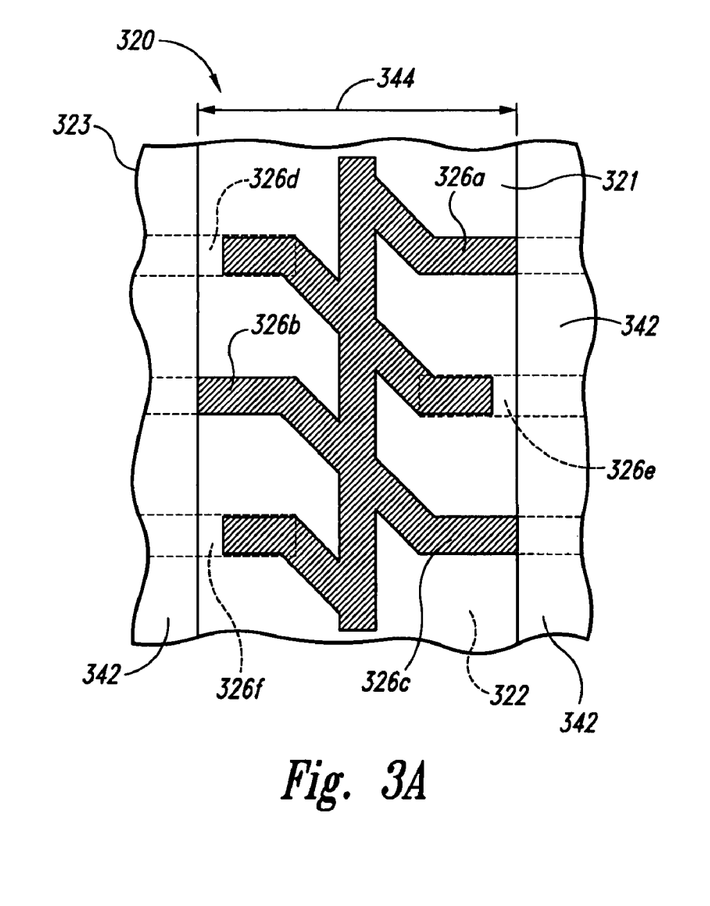
FIGS. 3A-3F are a series of schematic views illustrating various stages in a method of manufacturing an interconnecting substrate for use with a microelectronic die in accordance with an embodiment of the invention.

B. Embodiments of Methods for Manufacturing Interconnecting Substrates for Microelectronic Dies FIGS. 3A-3F are a series of schematic views illustrating various stages in a method of manufacturing an interconnecting substrate 320 ("substrate 320") in accordance with an embodiment of the invention. More specifically, FIGS. 3A, 3B, 3D and 3F are schematic top views, while FIGS. 3C and 3E are schematic cross-sectional views. Referring first to FIG. 3A, the substrate 320 includes a sheet of non-conductive material 323 (e.g., BT resin, FR4, etc.) having a first side 321 and an opposite second side 322. In the illustrated embodiment, a first plurality of conductive lines or traces 326 (e.g., copper traces; identified individually as a first conductive trace 326a, a second conductive trace 326b, and a third conductive trace 326c) are formed on the first side 321 using suitable plating, patterning, and etching processes known in the art. A second plurality of conductive traces 326 (identified individually as a fourth conductive trace 326d, a fifth conductive trace 326e, and a sixth conductive trace 326f) are formed on the second side 322 in a similar manner. In the illustrated embodiment, portions of the second plurality of conductive traces 326d-f are positioned in vertical alignment with corresponding portions of the first plurality of conductive traces 326a-c. Aligning the conductive traces 326 in this manner can facilitate alignment of the drill, laser, or other boring device used to form the vias described in detail below with reference to FIGS. 3B and 3C. In other embodiments, however, the conductive traces 326d-f on the second side 322 can be positioned independently of the conductive traces 326a-c on the first side 321.

As described in greater detail below, in one embodiment, the first plurality of conductive traces 326a-c can be used for signal transmission and the second plurality of conductive traces 326d-f can be used for grounding and/or power transmission. Separating the ground/power traces from the signal traces in this manner can favorably reduce signal noise caused by ground/power bounce and inductance loop effects. After forming, both sides of the non-conductive material 323 can be covered with a dielectric layer 342 (e.g., a solder mask) to protect the conductive traces 326. The dielectric layer 342 can be removed in a region 344, however, to facilitate the process steps that follow.

Figure 3B:
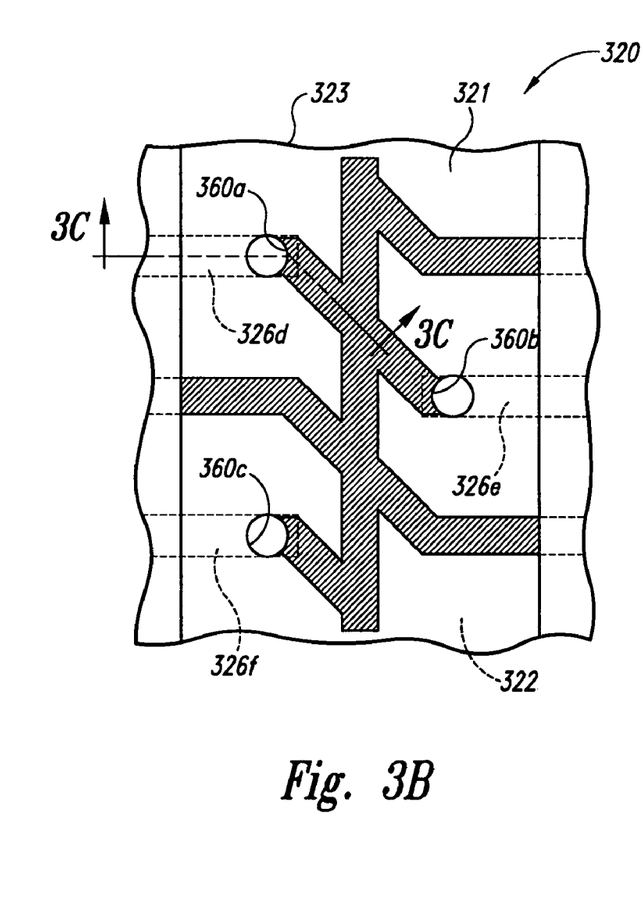
Figure 3C:
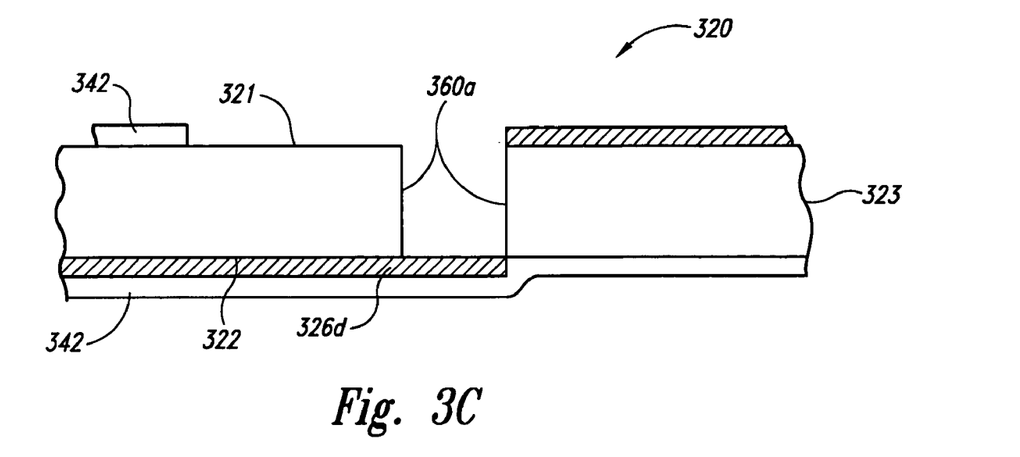

Referring next to FIG. 3B, a plurality of holes or vias 360 (identified individually as a first via 360a, a second via 360b, and a third via 360c) are formed in the substrate 320 so that they extend from the first side 321 of the non-conductive material 323 to the conductive traces 326d-f on the second side 322 of the non-conductive material 323. A cross-sectional view of this via configuration is shown in FIG. 3C, which is taken along line 3C-3C in FIG. 3B. As shown in FIG. 3C, the first via 360a extends through the non-conductive material 323, but stops at the fourth conductive trace 326d on the second side 322. The vias 360 illustrated in FIGS. 3B and 3C can be formed by any suitable method known in the art including, for example, drilling, etching, laser boring, etc.

Figure 3D:
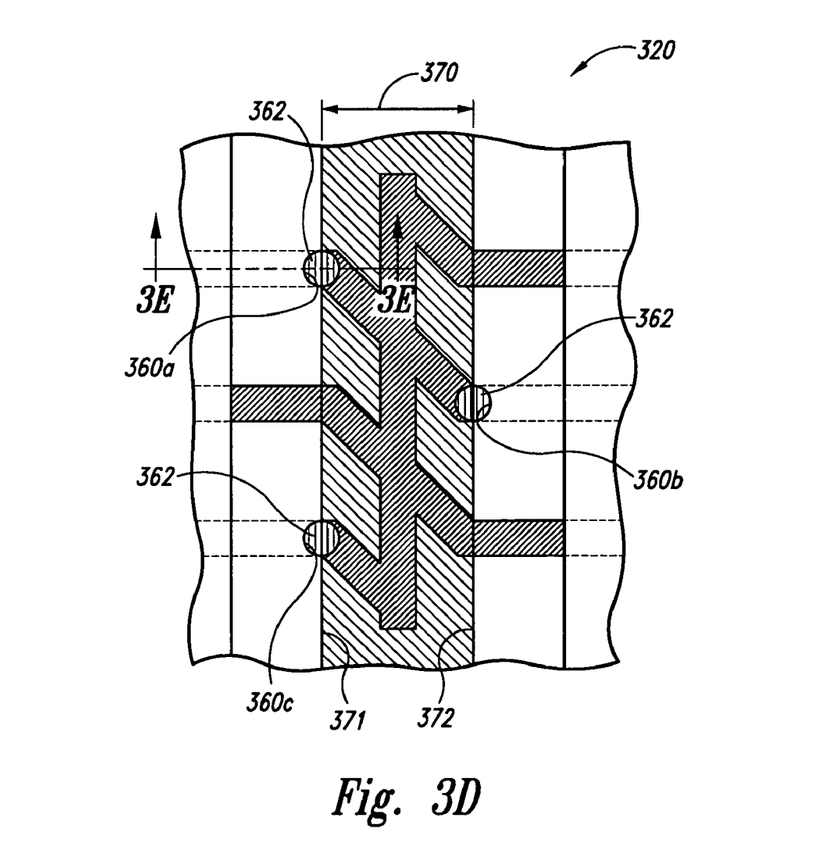
Figure 3E:
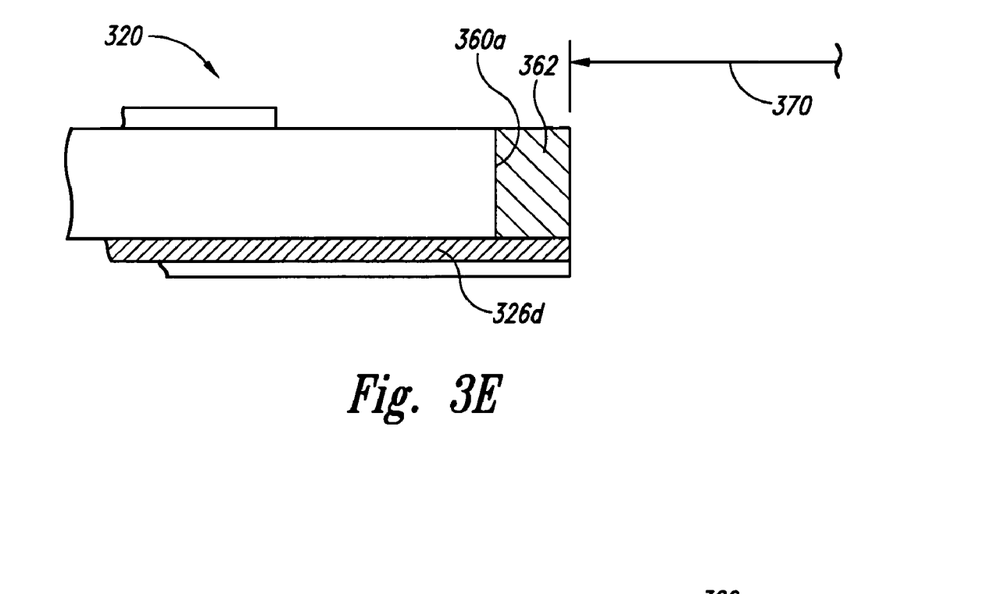

Referring next to FIG. 3D, each of the vias 360 can be at least partially filled with plug material 362 after forming. In this embodiment, a wide variety of materials known in the art can be used as the plug material 362 including, for example, epoxy resins, solder mask material, and/or other suitable materials that can be used to temporarily fill and/or stabilize the vias 360 during subsequent processing steps. After the vias 360 have been plugged, a slot 370 is formed through the non-conductive material 323 using any suitable method known in the art including routing, punching, cutting, etc. The slot 370 extends from a first edge portion 371 to a second edge portion 372. The first edge portion 371 is positioned so that it crosses at least a portion of the first via 360a and the third via 360c. Similarly, the second edge portion 372 is positioned so that it crosses at least a portion of the second via 360b.

Figure 3F:
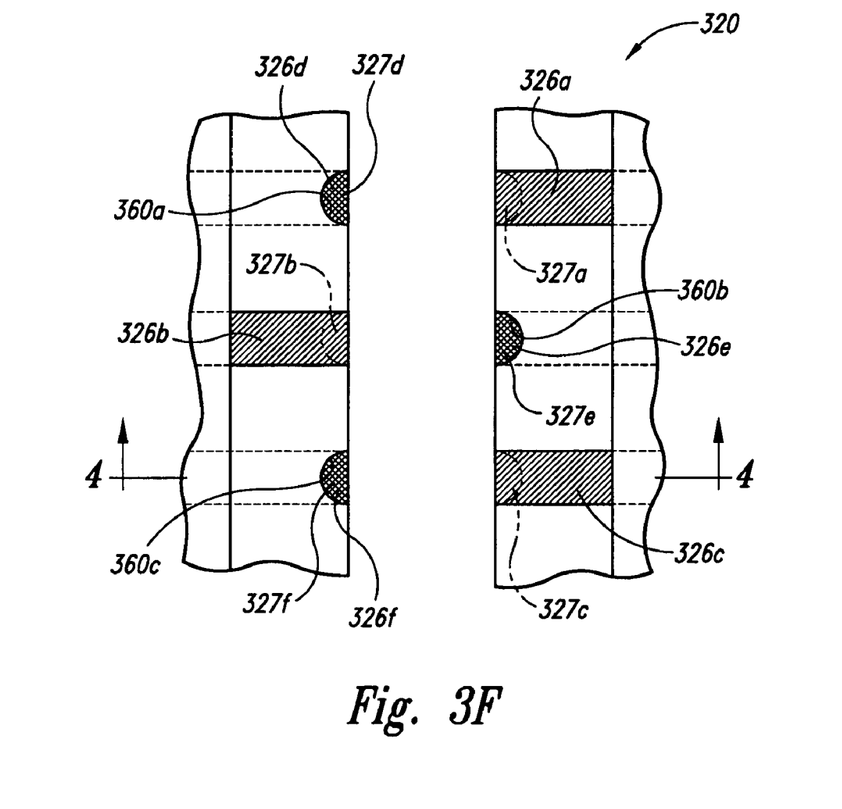

FIG. 3E is an enlarged cross-sectional view taken along line 3E-3E in FIG. 3D, and shows how the plug material 362 is carried by the remaining portion of the via 360a after the slot 370 has been formed in the substrate 320. After the slot 370 has been formed, the plug materials 362 can be removed from each of the vias 360 by etching, laser ablation, drilling, or other suitable method known in the art. Removing the plug material 362 from each via 360 forms a corresponding alcove along the respective edge of the slot 370 in which a portion of each of the conductive traces 326d-f is exposed, as shown in FIG. 3F. Next, contact areas 327a-c (e.g., wire-bond attach areas) on the conductive traces 326a-c, and contact areas 327d-f on conductive traces 326d-f, can be prepared for wire-bond attachment in a subsequent packaging step. In those embodiments in which the conductive traces 326 include copper, preparing the contact areas 327 can include plating the specified areas with nickel (Ni) and then gold (Au) using suitable methods known in the art. In other embodiments, other methods and/or materials can be used to facilitate wire-bond attachment to the conductive traces 326.

C. Embodiments of Packaged Microelectronic Devices

Figure 4:
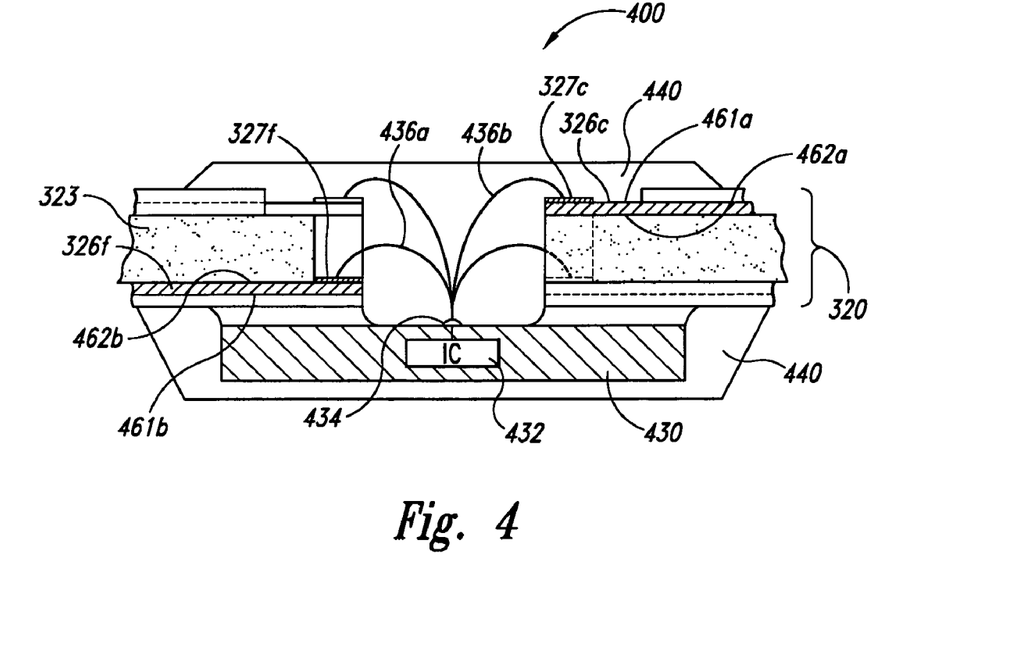
FIG. 4 is a schematic cross-sectional view of a packaged microelectronic device configured in accordance with an embodiment of the invention.

FIG. 4 is a schematic cross-sectional view of a packaged microelectronic device 400 configured in accordance with an embodiment of the invention. In the illustrated embodiment, the packaged microelectronic device 400 (e.g., a memory module, processing device, etc.) includes a die 430 attached to a substrate 320 manufactured as described above with reference to FIGS. 3A-3F. For ease of reference, the section view of the substrate 320 shown in FIG. 4 is taken along line 4-4 in FIG. 3F. As shown in FIG. 4, the third conductive trace 326c has a first surface 461a facing away from the non-conductive material 323 and a second surface 462a facing toward the non-conductive material 323. The third contact area 327c is formed on the first surface 461a of the third conductive trace 326c. The sixth conductive trace 326f has a first surface 461b facing away from the non-conductive material 323 and a second surface 462b facing toward the non-conductive material 323. The sixth contact area 327f is formed on the second surface 462b of the sixth conductive trace 326f.

In another aspect of this embodiment, the microelectronic die 430 is a memory device, a processor, or other type of component that includes an integrated circuit 432 electrically coupled to a series of terminals 434 (e.g., bond-pads). (Only one of the terminals 434 is shown in FIG. 4 because of the perspective of the view.) Each of the terminals 434 can be electrically coupled to one of the conductive traces 326 by a corresponding wire-bond 436. For example, a first one of the terminals 434 can be electrically coupled to the sixth conductive trace 326f by a first wire-bond 436a that extends from the terminal to the sixth contact area 327f. Similarly, a second one of the terminals 434 can be electrically coupled to the third conductive trace 326c by a second wire-bond 436b that extends from the terminal to the third contact area 327c. The other conductive traces (e.g., the conductive traces 326a, b, d and e) can be attached to individual terminals 434 with additional wire-bonds in a similar manner. After all of the terminals 434 have been electrically coupled to corresponding traces 326, the microelectronic die 430 and the portion of the substrate 320 around the wire-bonds 436 can be encased in a suitable mold compound 440.

One feature of the embodiment illustrated in FIG. 4 is that the conductive traces 326a-c on the first side 321 of the non-conductive material 323 can be used for signal transmission, while the conductive traces 326d-f on the second side 322 can be used for power and/or ground connections. Separating the trace planes in the foregoing manner can reduce noise and/or other problems that arise during signal transmission. In addition, placing the power and/or ground circuits on the second side 322 of the non-conductive material 323 can reduce the inductance loop, thereby reducing the potential for noise caused by ground/power bounce.

Figure 5:
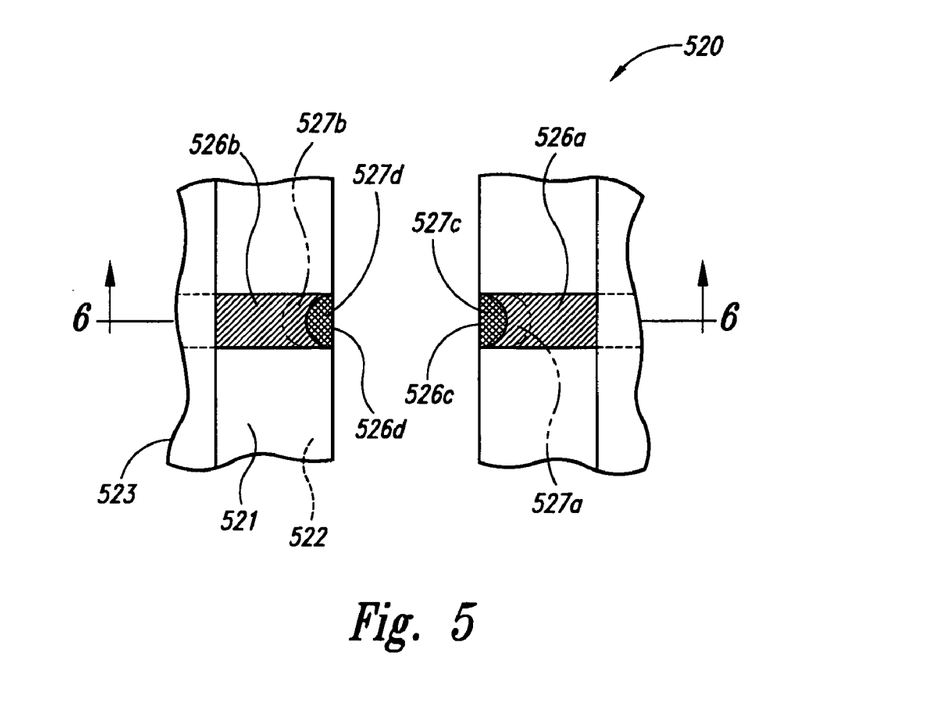
FIG. 5 is a schematic top view of an interconnecting substrate configured in accordance with another embodiment of the invention.

D. Other Embodiments of Interconnecting Substrates and Packaged Microelectronic Devices FIG. 5 is a schematic top view of an interconnecting substrate 520 configured in accordance with another embodiment of the invention. Many features of the substrate 520 are at least generally similar in structure and function to corresponding features of the interconnecting substrate 320 described above with reference to FIGS. 3A-3F. For example, the substrate 520 includes a first conductive trace 526a and a second conductive trace 526b formed on a first side 521 of a sheet of non-conductive material 523, and a third conductive trace 526c and a fourth conductive trace 526d formed on a second side 522 of the sheet of non-conductive material 523. In this particular embodiment, however, the first and second conductive traces 526a,b are at least approximately aligned with the third and fourth conductive traces 526c,d, respectively. Each of the conductive traces 526 includes a corresponding contact area 527 (e.g., wire-bond attach areas). As explained above, in those embodiments in which the conductive traces 526 include copper, the contact areas 527 can include nickel (Ni) plating followed by gold (Au) plating. In other embodiments, other methods and/or materials can be used to facilitate wire-bond attachment to the conductive traces 526.

Figure 6:
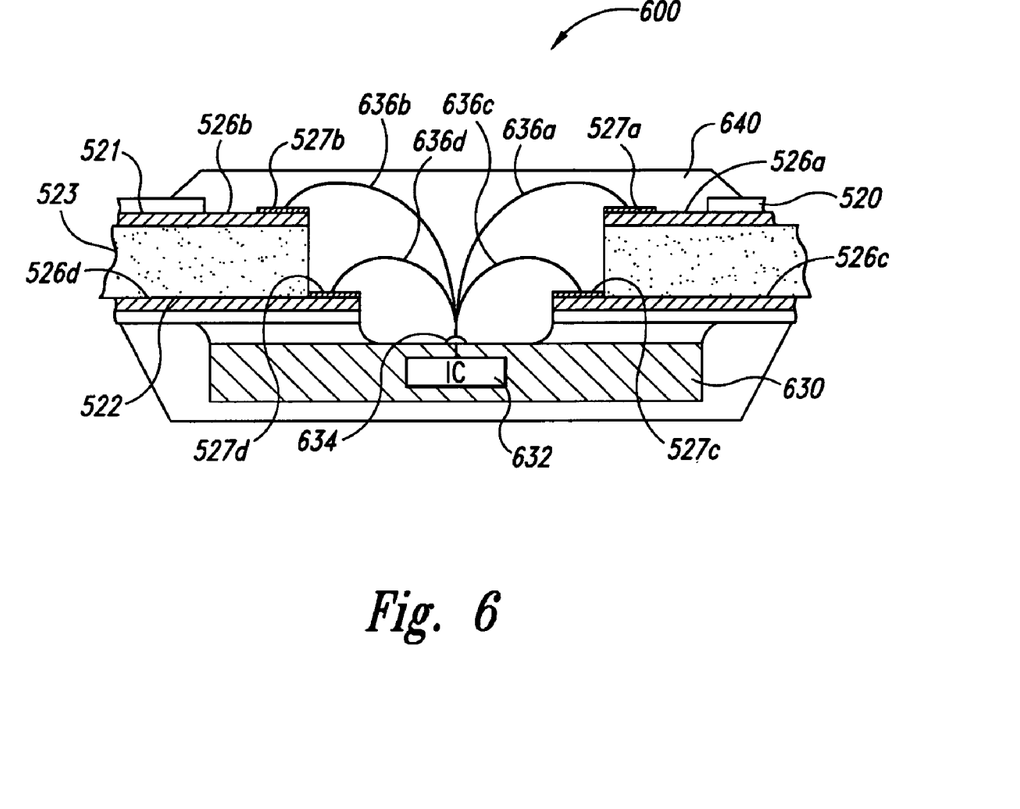
FIG. 6 is a schematic cross-sectional view of a packaged microelectronic device configured in accordance with a further embodiment of the invention.

FIG. 6 is a schematic cross-sectional view of a packaged microelectronic device 600 configured in accordance with a further embodiment of the invention. In the illustrated embodiment, the packaged microelectronic device 600 includes a die 630 attached to the interconnecting substrate 520 of FIG. 5. The section view of the substrate 520 shown in FIG. 6 is taken along line 6-6 in FIG. 5. In one aspect of this embodiment, the microelectronic die 630 is a memory device, processor, imager, or other type of component that includes an integrated circuit 632 electrically coupled to a series of terminals 634 (e.g., bond-pads). (Only one of the terminals 634 is shown in FIG. 6 because of the perspective of the view.) Each of the terminals 634 can be electrically coupled to one of the conductive traces 526 by a corresponding wire-bond 636. For example, a first one of the terminals 634 can be electrically coupled to the first conductive trace 526a by a first wire-bond 636a that extends from the terminal to the first contact area 527a. Similarly, a second one of the terminals 634 can be electrically coupled to the second conductive trace 526b by a second wire-bond 636b that extends from the terminal to the second contact area 527b. The other conductive traces (e.g., the conductive traces 526c,d) can be attached to individual terminals 634 with additional wire-bonds in a similar manner. In other embodiments, one or both of the conductive traces 526a and/or 526b on the first surface 521 can be electrically coupled to one or both of the conductive traces 526c and/or 526d on the second surface 522, respectively, by corresponding vias (not shown). After each of the terminals 634 has been electrically coupled to a corresponding trace 526, the microelectronic die 630 and the portion of the substrate 520 around the wire-bonds 636 can be encased in a suitable mold compound 640.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method of manufacturing a substrate for attachment to a microelectronic device, the method comprising:
   forming a conductive trace on a first side of a non-conductive material, the non-conductive material including a second side opposite the first side;
   forming a hole through the non-conductive material from the second side of the non-conductive material to the conductive trace, wherein at least a portion of the conductive trace covers the hole; and
   forming an edge of the non-conductive material, wherein the edge crosses through at least a portion of the hole.

2. The method of claim 1 wherein the conductive trace is a first conductive trace, and wherein the method further comprises forming a second conductive trace on the second side of the non-conductive material, wherein forming a hole includes forming a hole through the second conductive trace and the non-conductive material.

3. The method of claim 1 wherein forming an edge of the non-conductive material includes removing a section of the non-conductive material to form a slot through the non-conductive material.

4. The method of claim 1 wherein forming a hole includes forming a first hole, wherein forming an edge includes forming a first edge, and wherein the method further comprises:
   forming a second conductive trace on the first side of the non-conductive material;
   forming a second hole through the non-conductive material from the second side of the non-conductive material to the second conductive trace; and
   forming a second edge of the non-conductive material, wherein the second edge crosses through at least a portion of the second hole.

5. The method of claim 1 wherein forming a hole includes forming a first hole, and wherein the method further comprises:
   forming a second conductive trace on the first side of the non-conductive material; and
   forming a second hole through the non-conductive material from the second side of the non-conductive material to the second conductive trace, wherein forming an edge of the non-conductive material includes forming a first edge by removing a section of the non-conductive material to form a slot through the non-conductive material, the slot having the first edge that crosses through at least a portion of the first hole and a second edge that crosses through at least a portion of the second hole.

6. The method of claim 1 wherein forming an edge of the non-conductive material includes forming an edge that extends across a portion of the conductive trace.

7. The method of claim 1, further comprising forming a plug in the hole, wherein forming an edge of the non-conductive material includes cutting through a portion of the plug.

8. The method of claim 1, further comprising:
   forming a plug in the hole before forming an edge of the non-conductive material; and
   removing the plug after forming the edge of the non-conductive material.

9. The method of claim 1, further comprising forming a plug in the hole, wherein forming an edge of the non-conductive material includes removing a section of the non-conductive material to form a slot having a first edge that extends through at least a portion of the plug.

10. The method of claim 1 wherein forming a hole from the second side of the non-conductive material includes boring a hole that extends through the non-conductive material and stops at the second conductive trace.

11. The method of claim 1 wherein forming a hole includes boring a blind hole with a laser.

12. A method of manufacturing a substrate for attachment to a microelectronic device, the method comprising:
   forming a sheet of non-conductive material, the sheet having a first side and an opposite second side;
   forming a conductive trace on the first side of the sheet of non-conductive material, the conductive trace having a first surface facing toward the sheet of non-conductive material and a second surface facing away from the sheet of non-conductive material; and
   removing a section of the sheet of non-conductive material to form a first opening in the first side and a second opening in the second side, wherein the first opening in the first side of the sheet of non-conductive material provides access to an exposed portion of the first surface of the conductive trace.

13. The method of claim 12, further comprising boring a hole through the second side of the sheet of non-conductive material to expose the portion of the first surface of the conductive trace before removing the section of the sheet of non-conductive material to form the first and second openings.

14. The method of claim 12, further comprising boring a hole through the first side of the sheet of non-conductive material to expose the portion of the first surface of the conductive trace before removing the section of the sheet of non-conductive material, and wherein removing the section of the sheet of non-conductive material includes forming a slot in the non-conductive material adjacent to the hole.

15. The method of claim 12 wherein forming a conductive trace includes plating a portion of the non-conductive material.

16. The method of claim 12 wherein forming a sheet of non-conductive material includes curing a sheet of BT resin, and wherein forming a conductive trace includes plating a portion of the cured BT resin with copper.

17. The method of claim 12 wherein the conductive trace is a first conductive trace, and wherein the method further comprises forming a second conductive trace on the second side of the sheet of non-conductive material, wherein the first opening in the first side of the sheet of non-conductive material provides access to an exposed portion of the second conductive trace and access to the exposed portion of the first conductive trace.

18. The method of claim 12 wherein the conductive trace is a first conductive trace, and wherein the method further comprises:
   forming a second conductive trace on the second side of the sheet of non-conductive material, the second conductive trace having a first surface facing toward the sheet of non-conductive material and a second surface facing away from the sheet of non-conductive material, wherein the first opening in the first side of the sheet provides access to an exposed portion of the second surface of the second conductive trace;
   forming a first wire-bond contact area on the exposed portion of the first surface of the first conductive trace; and forming a second wire-bond contact area on the exposed portion of the second surface of the second conductive trace.

19. A method of manufacturing a microelectronic device having a die with an integrated circuit and a plurality of terminals electrically coupled to the integrated circuit, the method comprising:
providing a substrate having a first conductive trace on a first side of a non-conductive material and a second conductive trace on a second side of the non-conductive material;
attaching the die to the substrate;
electrically coupling a first terminal on the die to the first conductive trace on the first side of the non-conductive material; and
electrically coupling a second terminal on the die to the second conductive trace on the second side of the non-conductive material.

20. The method of claim 19 wherein electrically coupling the first terminal to the first conductive trace includes attaching a first wire-bond from the first terminal to the first conductive trace, and wherein electrically coupling the second terminal to the second conductive trace includes attaching a second wire-bond from the second terminal to the second conductive trace.

21. The method of claim 19 wherein electrically coupling a first terminal on the die to the first conductive trace includes electrically coupling the first terminal to a first contact area on the first conductive trace, wherein the first contact area is located on the first side of the non-conductive material, and wherein electrically coupling a second terminal on the die to the second conductive trace includes electrically coupling the second terminal to a second contact area on the second conductive trace, wherein the second contact area is located on the second side of the non-conductive material.

22. The method of claim 19:
wherein the first conductive trace has a first surface facing away from the non-conductive material and a second surface facing toward the non-conductive material, and the second conductive trace has a third surface facing away from the non-conductive material and a fourth surface facing toward the non-conductive material;
wherein electrically coupling a first terminal on the die to the first conductive trace includes electrically coupling the first terminal to a portion of the first surface of the first conductive trace; and
wherein electrically coupling a second terminal on the die to the second conductive trace includes electrically coupling the second terminal to a portion of the fourth surface of the second conductive trace.

23. The method of claim 19:
wherein the first conductive trace has a first surface facing away from the non-conductive material and a second surface facing toward the non-conductive material, and the second conductive trace has a third surface facing away from the non-conductive material and a fourth surface facing toward the non-conductive material;
wherein electrically coupling a first terminal on the die to the first conductive trace includes attaching a first end of a first wire-bond to the first terminal and a second end of the first wire-bond to the first surface of the first conductive trace; and
wherein electrically coupling a second terminal on the die to the second conductive trace includes attaching a first end of a second wire-bond to the second terminal and a second end of the second wire-bond to the fourth surface of the second conductive trace.

24. The method of claim 19 wherein attaching the die to the substrate includes positioning the second conductive trace between the die and the non-conductive material, wherein the second conductive trace has a first surface facing away from the non-conductive material and a second surface facing toward the non-conductive material, and wherein electrically coupling a second terminal on the die to the second conductive trace includes attaching a wire-bond from the second terminal to a contact area on the second surface of the second conductive trace.

25. The method of claim 19:
wherein the first conductive trace has a first surface facing away from the non-conductive material and a second surface facing toward the non-conductive material;
wherein the second conductive trace has a third surface facing toward the non-conductive material and a fourth surface facing away from the non-conductive material;
wherein electrically coupling a first terminal on the die to the first conductive trace includes attaching a first wire-bond from the first terminal to a first contact area on the first surface of the first conductive trace; and
wherein electrically coupling a second terminal on the die to the second conductive trace includes attaching a second wire-bond from the second terminal to a second contact area on the third surface of the second conductive trace.

26. A method of manufacturing a substrate for attachment to a microelectronic device, the method comprising:
forming a first conductive trace on a first side of a non-conductive material;
forming a second conductive trace on a second side of the non-conductive material;
forming a hole through the non-conductive material from the first side to the second conductive trace, wherein at least a portion of the second conductive trace covers the hole;
forming a slot through the non-conductive material, the slot having a first edge opposite a second edge, wherein the first edge of the slot extends across at least a portion of the hole; and
forming a wire-bond attach area on a surface of the second conductive trace within the hole, wherein the surface faces toward the non-conductive material.

27. The method of claim 26 wherein forming a hole includes forming a hole through the first conductive trace and the non-conductive material.

28. The method of claim 26 wherein forming a hole includes forming a first hole, wherein forming a wire-bond attach area includes forming a first wire-bond attach area, and wherein the method further comprises:
forming a third conductive trace on the second side of the non-conductive material;
forming a second hole through the non-conductive material from the first side of the non-conductive material to the third conductive trace, wherein the second edge of the slot crosses through at least a portion of the second hole; and
forming a second wire-bond attach area on a surface of the third conductive trace within the second hole, wherein the surface faces toward the non-conductive material.

29. The method of claim 26 wherein the first edge of the slot through the non-conductive material extends across a portion of the second conductive trace.

30. The method of claim 26, further comprising:
forming a plug in the hole before forming the slot through the non-conductive material; and
removing at least a portion of the plug after forming the slot through the non-conductive material and before forming the wire-bond attach area on the surface of the second conductive trace within the hole.

31. A method of manufacturing a microelectronic device, the method comprising:
forming a first conductive trace on a first side of a non-conductive material;
forming a second conductive trace on a second side of the non-conductive material;
attaching a microelectronic die to the second side of the non-conductive material, the microelectronic die having an integrated circuit electrically coupled to at least first and second terminals;
electrically coupling a first wire-bond from the first terminal on the die to a first surface of the first conductive trace, wherein the first surface faces away from the non-conductive material; and
electrically coupling a second wire-bond from the second terminal on the die to a second surface of the second conductive trace, wherein the second surface faces toward the non-conductive material.

32. The method of claim 31 wherein forming a first conductive trace includes forming a first conductive line for transmitting information to the die, and wherein forming a second conductive trace includes forming a second conductive line for transmitting power to the die.

33. The method of claim 31 wherein forming a first conductive trace includes forming a first conductive trace for transmitting information to the die, wherein forming a second conductive trace includes forming a second conductive trace for transmitting power to the die, and wherein the method further comprises forming a third conductive trace on the second side of the non-conductive material for electrically grounding the die.

34. The method of claim 31, further comprising forming a slot though the non-conductive material, the slot having a first edge and an opposing second edge, wherein the first and second terminals on the die are positioned between the first and second edges of the slot.

35. The method of claim 31, further comprising encasing the die and the first and second wire-bonds with mold compound.

* * * * *

UNITED STATES PATENT AND TRADEMARK OFFICE
CERTIFICATE OF CORRECTION

| | |
|---|---|
| PATENT NO. | : 7,326,591 B2 |
| APPLICATION NO. | : 11/217152 |
| DATED | : February 5, 2008 |
| INVENTOR(S) | : Chong et al. |

It is certified that error appears in the above-identified patent and that said Letters Patent is hereby corrected as shown below:

In column 12, line 16, in Claim 34, delete "though" and insert -- through --, therefor.

Signed and Sealed this

Thirteenth Day of May, 2008

JON W. DUDAS
*Director of the United States Patent and Trademark Office*